United States Patent [19]

Aoki et al.

[11] 4,217,505
[45] Aug. 12, 1980

[54] MONOSTABLE MULTIVIBRATOR

[75] Inventors: Kazuhide Aoki; Kenji Kawagai, both of Kawasaki; Akira Nagae, Yokohama; Shuichi Goto, Kawasaki, all of Japan

[73] Assignee: Tokyo Shibaura Denki Kabushiki Kaisha, Japan

[21] Appl. No.: 954,822

[22] Filed: Oct. 26, 1978

[30] Foreign Application Priority Data

Oct. 28, 1977 [JP] Japan ................ 52/129276

[51] Int. Cl.² ............................................. H03K 3/284
[52] U.S. Cl. ..................................... 307/273; 307/279
[58] Field of Search ................. 307/273, 279; 328/207

[56] References Cited

U.S. PATENT DOCUMENTS

| 3,820,029 | 6/1974 | McKinley | 307/273 X |
| 3,883,756 | 5/1975 | Dragon | 307/273 X |
| 3,904,894 | 9/1975 | Ciolli | 307/273 X |

OTHER PUBLICATIONS

Semiconductor Data Library/CMDS, vol. 5, Series B, pp. 5-332-336, Motorola, Inc., 1976.
Integrated Circuits Data Book, pp. 570, 571, Tokyo Shibaura Electric Co., Ltd., 1976.

Primary Examiner—John S. Heyman
Attorney, Agent, or Firm—Finnegan, Henderson, Farabow, Garrett & Dunner

[57] ABSTRACT

Disclosed is a monostable multivibrator in which an output voltage of an integrating circuit and a reference voltage from a reference voltage source are compared by means of a comparator, and a flip-flop is set in response to a comparison voltage of the comparator and reset in response to an external reset signal. The output of the flip-flop operates a transistor for controlling the discharge of a capacitor of the integrating circuit, and is taken out as an output pulse of the monostable multivibrator.

9 Claims, 9 Drawing Figures

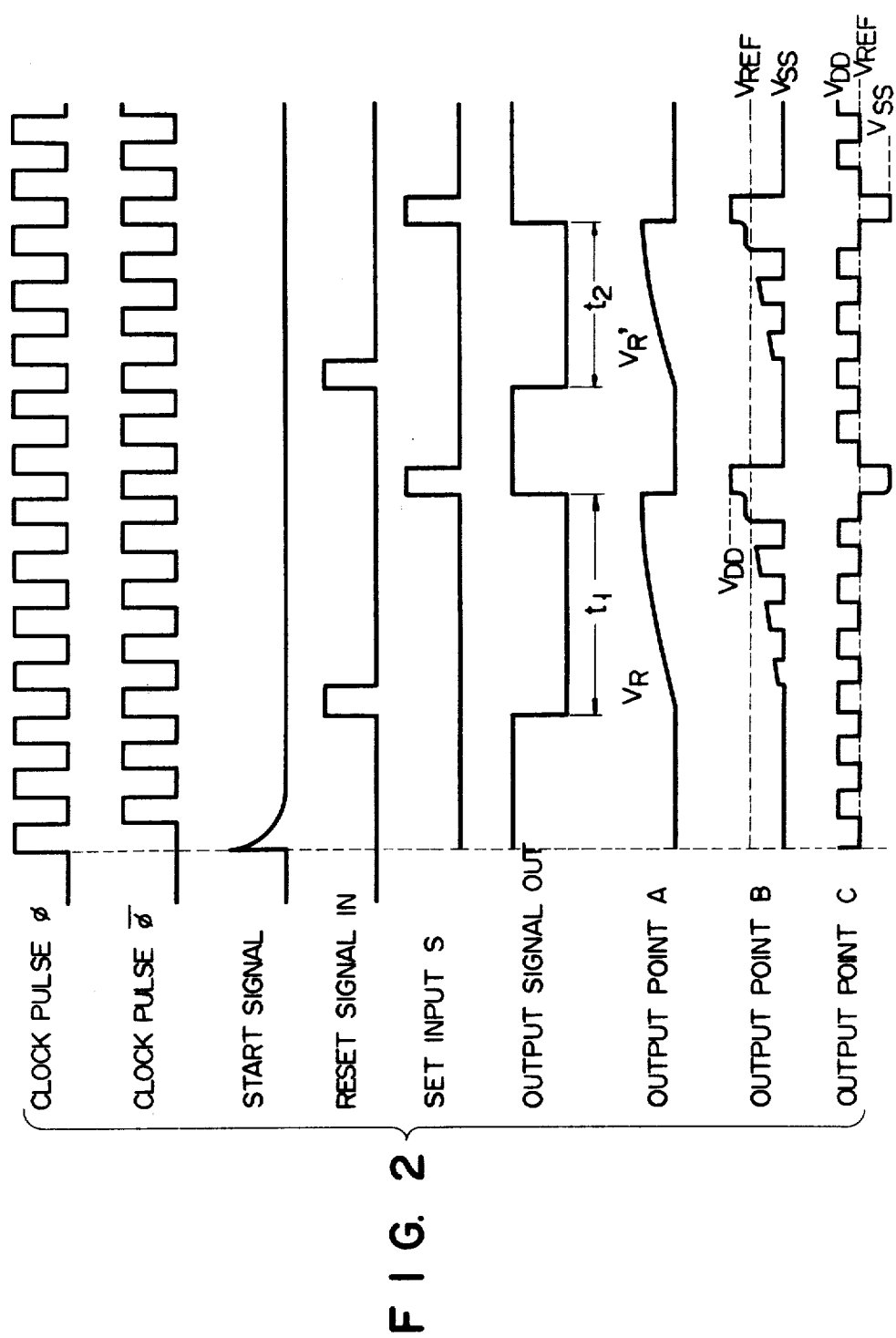
F I G. 2

MONOSTABLE MULTIVIBRATOR

BACKGROUND OF THE INVENTION

This invention relates to a monostable multivibrator.

A conventional monostable multivibrator including MOS FET's (monolithic oxide semiconductor field-effect transistors) is composed of an integrating circuit, an inverter connected to the output terminal of the integrating circuit, a flip-flop, and a transistor on-off controlled by the output of the flip-flop and controlling the discharge of a capacitor of the integrating circuit. In such monostable multivibrator, the controlling transistor conducts to reduce the connecting point of a resistor and the capacitor of the integrating circuit to level "0" when the output of the flip-flop is at level "1". When the reset input to the flip-flop is "1" and its output becomes "0", the capacitor is charged through the resistor, and the output of the inverter gets level "0" if the connecting point exceeds the inversion level of the inverter. By this "0" level output of the inverter, the flip-flop is set to have its output at level "1", therby causing the connecting point to resume level "0".

According to the aforementioned monostable multivibrator, the output of the flip-flop is regarded as the output of the multivibrator. Here the pulse width of the output of the multivibrator is determined by the resistor and capacitor of the integrating circuit and the inverted level of the inverter. The resistor or capacitor may be adjusted externally, whereas the inverted level of the inverter varies widly in accordance with the dispersion in threshold voltage Vth because the MOS FET's are subject to substantial dispersion in the threshold voltage depending on the manufacturing conditions. The range of the level dispersion in the inverter is twice or thrice as large as the pulse width of the output of the multivibrator. Such extensive dispersion presents a great problem, practically.

SUMMARY OF THE INVENTION

Accordingly, the object of this invention is to provide a monostable multivibrator hardly subject to any dispersion.

According to this invention, there is provided a monostable multivibrator in which the dispersion in the output pulse width are improved by comparing the charging voltage of a capacitor of an integrating circuit with a reference voltage.

BRIEF DESCRIPTION OF THE DRAWINGS

FIG. 2 is a time chart showing signals delivered from each part of the monostable multivibrator of FIG. 1;

DETAILED DESCRIPTION OF THE PREFERRED EMBODIMENTS

Figure 1:
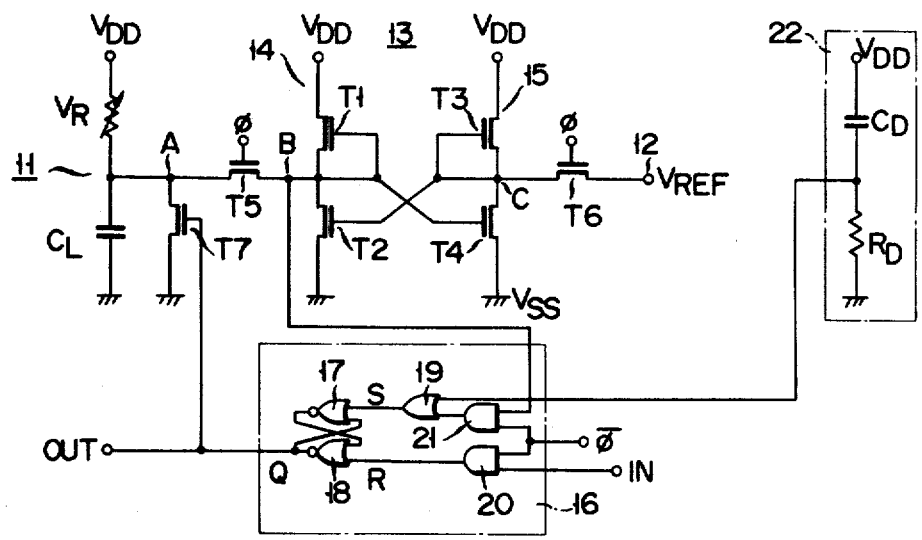
FIG. 1 is a circuit diagram of a monostable multivibrator according to an embodiment of this invention.

Referring now to FIG. 1, there is shown an integrating circuit 11 including a variable resistor $V_R$ and a capacitor $C_L$ connected in series between a power source $V_{DD}$ and the ground. A comparator 13 is composed of an inverter 14 including a depletion type MOS transistor T1 and an enhancement type MOS transistor T2 connected in series between the power source $V_{DD}$ and the ground, and an inverter 15 including a depletion type MOS transistor T3 and an enhancement type MOS transistor T4 connected in series between the power source $V_{DD}$ and the ground. The output terminal B of the inverter 14 or the connecting point of the transistors T1 and T2 is connected to the gates of the transistors T1 and T4, and also to the output point A of the integrating circuit 11 or the connecting point of the variable resistor $V_R$ and the capacitor $C_L$ via the source-drain of an enhancement type MOS transistor T5. The output terminal C of the inverter 15 or the common connecting point of the transistors T3 and T4 is connected to the gates of the transistors T2 and T3, and also to a reference voltage terminal 12, which is connected to a reference voltage source $V_{REF}$, via the source-drain of an enhancement type MOS transistor T6. The reference voltage is obtained from a voltage dividing resistor circuit connected to a voltage source. An enhancement type MOS transistor T7 is connected between the output terminal of the integrating circuit 11 and the ground, that is, in parallel with the capacitor $C_L$.

Meanwhile, in an R-S flip-flop 16, one input terminal and the output terminal of a NOR gate 17 are connected with the output terminal and one input terminal of a NOR gate 18, respectively. The other input terminals of the NOR gates 17 and 18 are connected with the output terminals of an OR gate 19 and an AND gate 20, respectively. One input terminal of the OR gate 19 is connected with the output terminal of an AND gate 21, while the other input terminal is connected with a start circuit 22. One input terminal of each of the AND gates 20 and 21 is connected to a terminal which is supplied with a clock pulse $\phi$. The other input terminal of the AND gate 20 is connected to a terminal supplied with a reset signal IN, while the other input terminal of the AND gate 21 is connected with the output point B of the inverter 14. The output of the NOR gate 18 or the output Q of the flip-flop 16 is connected to both the gate of the MOS transistor T7 and an output terminal OUT. The start circuit 22 is formed of a capacitor $C_D$ and a resistor $R_D$ connected in series between the power source $V_{DD}$ and the ground, the connecting point of the capacitor and resistor being connected to the other input terminal of the OR gate 19.

Now there will be described the operation of the monostable multivibrator of the aforementioned configuration, as shown in FIG. 1, on the assumption on that the comparator 13 and the integrating circuit 11 are independent of each other, having no operative interaction. First, when the voltage $V_{DD}$ is applied to the monostable multivibrator, a start signal as shown in FIG. 2 appears at the output terminal of the start circuit 22. In response to this start signal, the flip-flop 16 is set to have its output Q at "1". Accordingly, the transistor T7 is caused to conduct, and the output point A is reduced to the ground potential. This state is maintained until the reset signal IN is supplied to the flip-flop 16. When the reset signal IN becomes "1", the output Q of the flip-flop 16 becomes "0" with the clock pulse $\bar{\phi}$ at "1", thereby rendering the transistor T7 nonconducting. In consequence, the potential at the output point A gradually increases as the capacitor $C_L$ is charged in accordance with a time constant determined by the resistance value of the variable resistor $V_R$ and the capacitance of the capacitor $C_L$.

On the other hand, in the voltage comparator 13, the transistors T5 and T6 conduct when a clock pulse $\phi$ becomes "1". Thus, the voltage $V_A$ at the output point A is compared with the reference voltage $V_{REF}$, and a voltage corresponding to a digital value indicating the result of the voltage comparison appears at the output point B at a point of time when the clock pulse $\bar{\phi}$ becomes "1" (i.e. $\phi$="0"). That is, if $\phi$="1", the voltages $V_B$ and $V_C$ at the output point B and C become $$V_B = \frac{V_{DD} \cdot R_{T5} + V_A \cdot R_{T1}}{R_{T1} + R_{T5}} \text{ and}$$
$$V_C = \frac{V_{DD} \cdot R_{T6} + V_{REF} \cdot R_{T3}}{R_{T3} + R_{T6}}$$

where $R_{T1}$, $R_{T5}$, $R_{T3}$ and $R_{T6}$ are the respective "on" resistances of the transistors T1, T5, T3 and T6. If $R_{T1}=R_{T3}$ and $R_{T5}=R_{T6}$, the difference between the voltages $V_B$ and $V_C$ is proportional to the difference between the voltage $V_A$ and $V_{REF}$, and the voltages at the output point B and C are charged at either the supply voltage $V_{DD}$ or the ground potential $V_{SS}$ with $\phi$="0". Namely, if $R_{T1}=R_{T3}$ and $R_{T5}=R_{T6}$, $V_B=V_{SS}$="0" and $V_C=V_{DD}$="1" when $V_A<V_{REF}$ and $\phi$="0", and $V_B=V_{DD}$="1" and $V_C=V_{SS}$="0" when $V_A>V_{REF}$ and $\phi$="0". Accordingly, the reset signal IN becomes "1", and the voltage at the output point A increases gradually. Where $\phi$="0", $V_B$="0" until the voltage $V_A$ becomes equal to the reference voltage $V_{REF}$. If $V_A$ exceeds $V_{REF}$ after the lapse of a time, $V_B$ is inverted to "1" when $\phi$="0". As a result, "1" appears at the set terminal S of the flip-flop 16 to make the output Q "1" at the point of time when $\bar{\phi}$ becomes "1", thereby allowing the transistor T7 to conduct to make $V_A$ "0". This state is maintained until the next reset signal IN is supplied. Accordingly, the output Q of the flip-flop 16 becomes "Q" in response to the reset signal IN, and returns to "1" after a time. That is, the flip-flop 16 operates as a monostable multivibrator. In this operation, a pulse width corresponding to time t1 when the output OUT or Q becomes "0" may be adjusted by changing the resistance value of the variable resistor $V_R$. If the resistance value of the variable resistor $V_R$ is reduced, there may be obtained a pulse width corresponding to time t2, for example.

Thus, the charging voltage of the integrating circuit 11 and the reference voltage $V_{REF}$ are compared with each other, and may therefore be rendered constant, so that the pulse width (t1 or t2) of the output OUT of the multivibrator will hardly vary.

Figure 3:
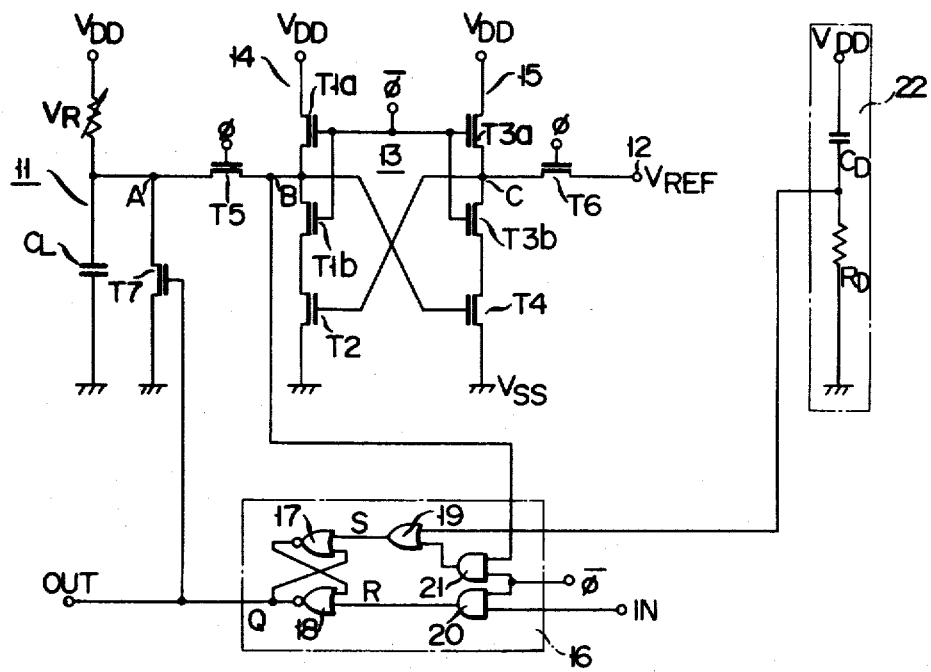
FIG. 3 is a circuit diagram of a monostable multivibrator according to another embodiment of the invention in which enhancement type MOS FET's are used for the inverter load element.

Referring now to FIG. 3, showing a monostable multivibrator according to another embodiment, the load element of the inverter 14 is formed of a series circuit of enhancement type MOS transistors T1a and T1b, the connecting point of which becomes the output terminal B. Similarly, the load element of the inverter 15 is formed of a series circuit of enhancement MOS transistors T3a and T3b, the connecting point of which becomes the output point C. The clock pulse $\bar{\phi}$ is supplied to the respective gates of the transistors T1a, T1b, T3a and T3b.

The multivibrator of FIG. 3 operates only when the clock pulse $\bar{\phi}$ supplied to the gates of the transistors T1a and T3a of the inverters 14 and 15 is "1". Accordingly, the transistors T5 and T6 conduct with $\phi$="1", when the voltages $V_A$ and $V_{REF}$ are applied to the output points B and C, respectively. The voltages applied to these output points B and C are compared with each other when $\phi$="0". Therefore, according to the multivibrator of FIG. 3, there is not required the equalization of the "on" resistances of the MOS transistors that is essential to the multivibrator of FIG. 1, and the voltages at the output points B and C are compared with each other, so that the output points A and the terminal 12 will not be affected by the voltages at the output points B and C. Since the circuit construction of FIG. 3 is the same as the one shown in FIG. 1 except the circuit construction of the comparator 13, the description thereof is omitted here with like reference numerals designating the same parts.

Figure 4:
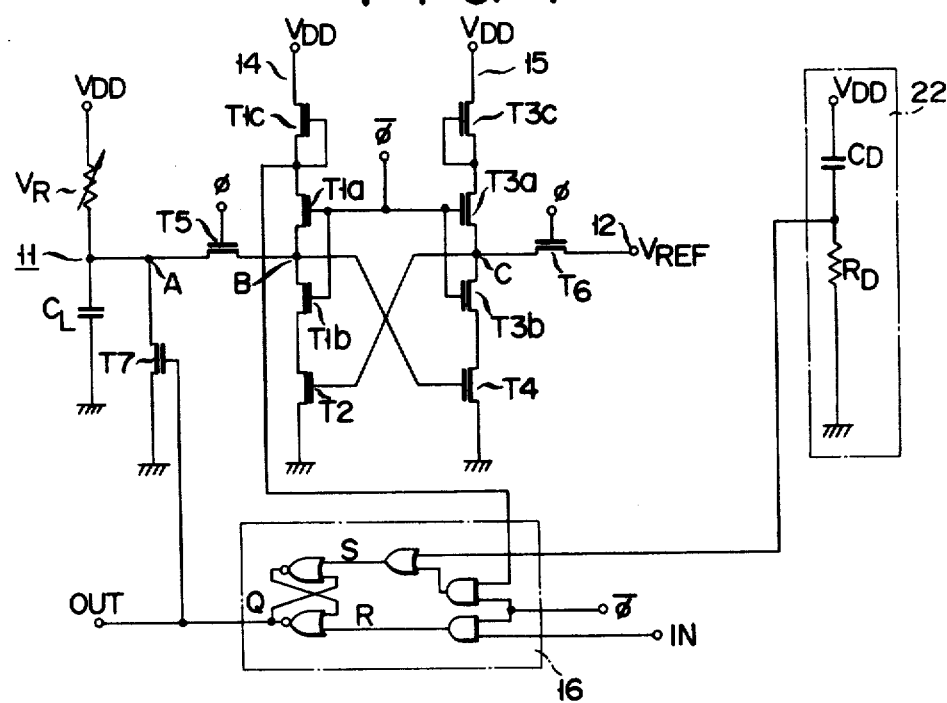
FIG. 4 is a circuit diagram of a modification of the monostable multivibrator of FIG. 3 in which depletion type MOS FET's are connected to the enhancement type MOS FET's.

Referring now to FIG. 4, there is shown a modification of the multivibrator of FIG. 3. In this multivibrator of FIG. 4, all the transistors are of the enhancement type, so that the output level of the comparator 13 falls below the supply voltage $V_{DD}$ by threshold voltage Vth of the transistor. To avoid the level drop, depletion type transistors T1c and T3c are connected, respectively, between the transistors T1a and T3a and the power source $V_{DD}$. By deriving an output from between the transistors T1c and T1a, the output level may be raised to the supply voltage $V_{DD}$. Thus, in the multivibrator of FIG. 4, the flip-flop 16 is easier to design, and may be reduced in power consumption due to the current limiting effect of the transistors T1c and T3c.

Figure 5:
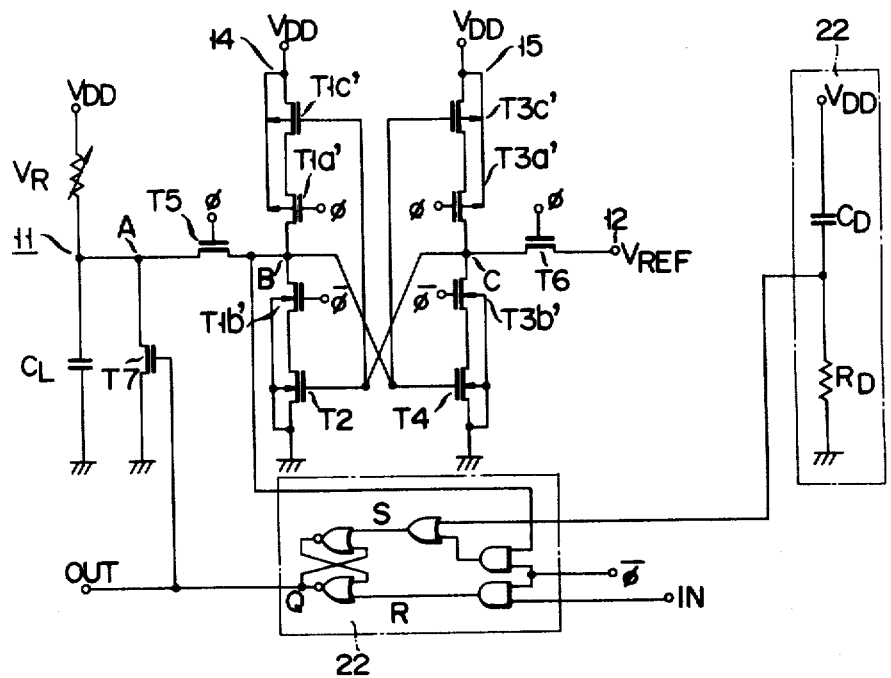
FIG. 5 is a circuit diagram of a monostable multivibrator according to still another embodiment of the invention in which the inverter has complementary MOS structure.

In an embodiment of FIG. 5, the inverters 14 and 15 of the comparator 13 are of complementary construction. That is, the inverter 14 is formed of a series circuit of p-channel MOS transistors T1c' and T1a' and n-channel MOS transistors T1b' and T2. Likewise, the inverter 15 is formed of a series circuit of p-channel transistors T3c' and T3a' and n-channel transistors T3b' and T4. The gates of the transistors T1c' and T2 are connected to the output point C, while the gates of the transistors T3c' and T4 are connected to the output point B. The gates of the transistors T1a', T1b', T3a' and T3b' are supplied with the clock pulse $\phi$.

According to the multivibrator of FIG. 5, the transistors T1a, T1b, T3b conduct only when the clock pulse $\bar{\phi}$ is "1", thereby operating the complementary inverters 14 and 15. Therefore, this multivibrator consumes less power as compared with the multivibrator of FIG. 4.

Figure 6:
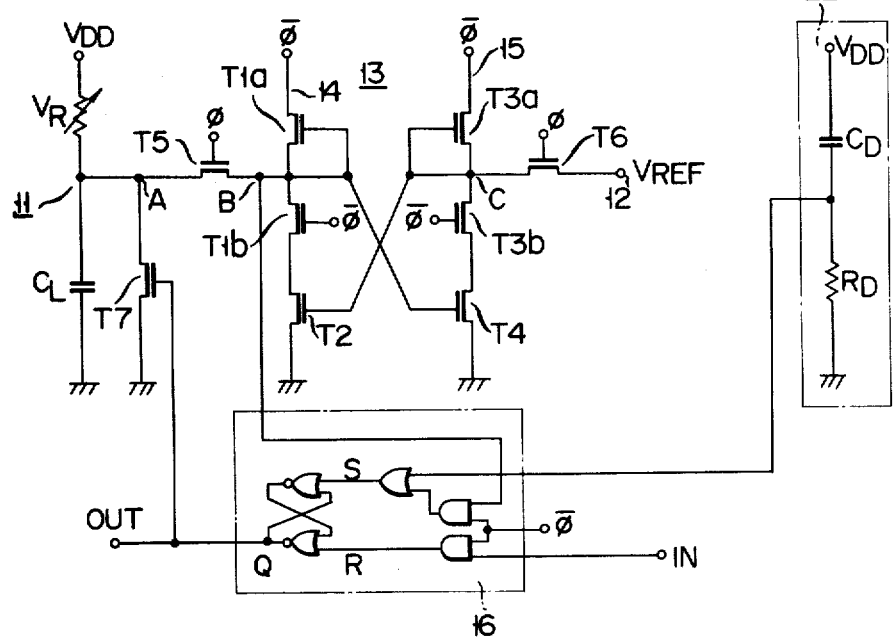
FIG. 6 is a circuit diagram of a monostable multivibrator according to a further embodiment in which a clock pulse is used as the power source for the inverter.

In an embodiment of FIG. 6, the gate of the transistor T1a of the inverter 14 and the gate of the transistor T4 of the inverter 15 are connected to the output point B, while the gates of the transistor T2 of the inverter 14 and the transistor T3a of the inverter 15 are connected to the output point C. The power supply terminals of the two inverters 14 and 15 are supplied with the clock pulse $\bar{\phi}$, and the gates of the transistors T1b and T3b are also supplied with the clock pulse $\bar{\phi}$.

According to the monostable multivibrator of FIG. 6, the transistors T1b and T3b conduct and the supply voltage is supplied only when the clock pulse $\bar{\phi}$ is "1". At the same time operate the inverters 14 and 15. That is, the inverters 14 and 15 operate for a period equivalent to the pulse width of the pulse $\bar{\phi}$. Therefore, the operating time of the inverters is short, enabling reduction in power consumption.

Figure 7:
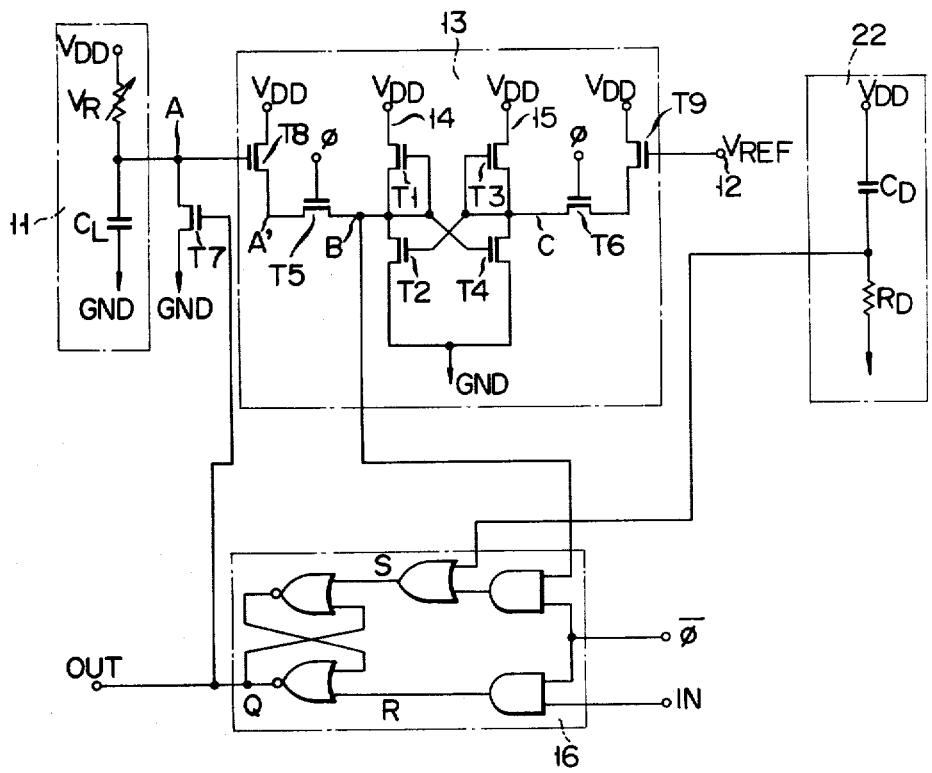
FIG. 7 is a circuit diagram of a static-system monostable multivibrator according to a further embodiment.

In the multivibrator of FIG. 3, for example, among the aforementioned multivibrators of FIGS. 1 to 6, which are of dynamic system, a leak will be caused at the output point B if the frequency of the clock pulse $\phi$ is too low. FIG. 7 shows a static-system monostable multivibrator capable of avoiding such leak. In this embodiment, the transistors T5 and T6 of the comparator 13 are connected to the power source $V_{DD}$ via enhancement type MOS transistors T8 and T9, respectively. The gates of these transistors T8 and T9 are connected, respectively, to the output point A and the reference voltage terminal 12. Being the same as those of the circuit shown in FIG. 3, other portions are designated by like reference numerals, and omitted from the description here.

According to the multivibrator of FIG. 7, the voltages at the output point A and the terminal 12 are delivered directly to output points A' and 12', respectively, and the voltages applied to the output points B and C may be determined by the ratios of the transistors T1 and T2 and the transistors T3 and T4, respectively. Therefore, the multivibrator may operate stably without involving any drop in the potentials at the output points B and C. Since the input impedance of the comparator 13 is almost infinite, the comparator 13 is as good as disconnected from the output of the integrating circuit 11 and the reference voltage source $V_{REF}$. Thus, the output point A and the reference voltage source $V_{REF}$ will never be affected by the comparator 13, so that the pulse width of the output pulse of the monostable multivibrator will be improved in accuracy.

Figure 8:
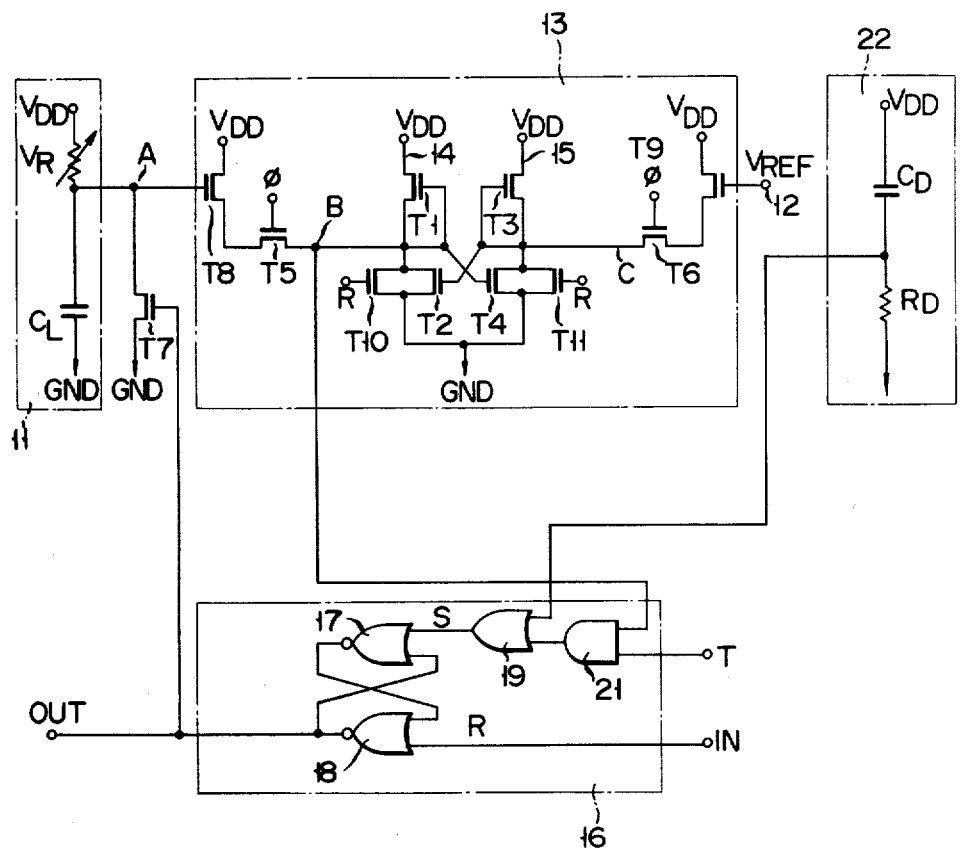
FIG. 8 is a circuit diagram of a monostable multivibrator according to an additional embodiment of the invention in which the initial values at the start of charging for the output points of the comparator of the multivibrator of FIG. 7 may be set.
Figure 9:
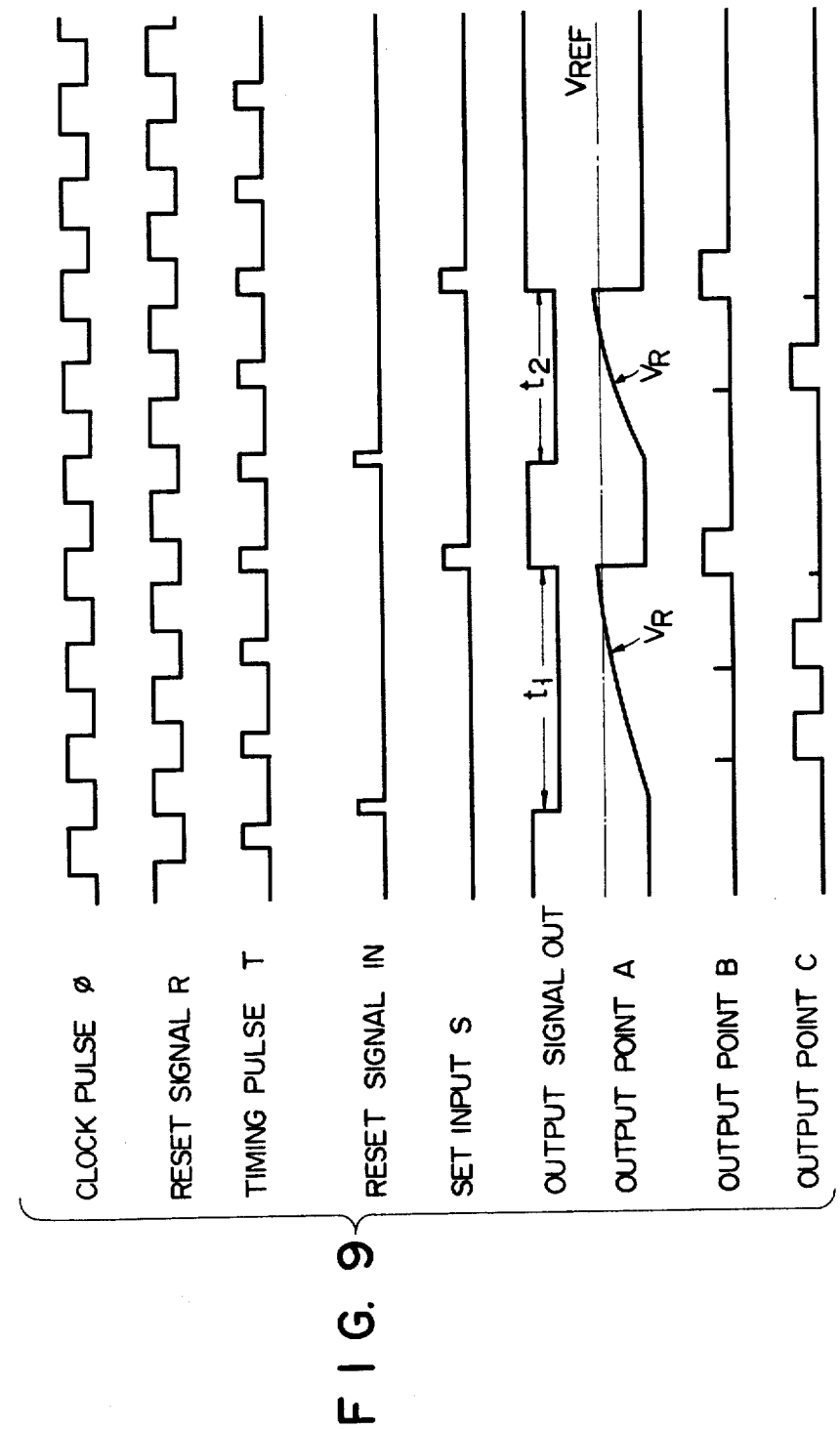
FIG. 9 is a time chart for illustrating the operation of the monostable multivibrator of FIG. 8.

Referring now to FIG. 8, there is shown a multivibrator so designed as to set the initial values at the start of charging for the output points B and C of the comparator 13 of FIG. 7. That is, transistors T10 and T11 are connected in parallel with the transistors T2 and T4, respectively. The gates of these transistors T10 and T11 are supplied with a reset signal R deviated from the clock pulse $\phi$ in pulse, as shown in FIG. 9. In the flip-flop 16, the two input terminals of the AND gate 21 are supplied with a timing pulse T (pulse repetition: a few microseconds) and the output signal of the comparator 13, and the output of the AND gate 21 becomes the set signal. The reset signal IN is directly supplied to the NOR gate 18. In the circuit of FIG. 8, the output points B and C becomes "0" with the reset signal R at "1", when the clock pulse $\phi$ becomes "1". When the reset signal R turns to "0", the stray capacity of the output point B is charged through the transistors T8 and T5 and also through the transistor T1. Likewise, the stray capacity of the output point C is charged through the transistors T9 and T6 and the transistor T3. Here if the conductances of the transistors T1 and T3 and the transistors T5 and T6 are equal, the ratios W/L (W: channel width, L: channel length) of the transistors T8 and T9 are equal, and the stray capacities of the output points B and C are equal, the charging speed may be determined by the gate voltages of the transistors T8 and T9. If the voltage at the output point A is lower than the reference voltage, the output points B and C are at "0" and "1", respectively when $\bar{R}\cdot\phi$="1". If the voltage at the output point A gets higher than the reference voltage, the output points B and C take levels "1" and "0", respectively. When the timing pulse T becomes "1" in this state, the flip-flop 16 is set to make the output Q "1", and the transistor T7 conducts to reduce the output point A to level "0". Such series of operations are shown in the time chart of FIG. 9. The pulse width (a few milliseconds) of the output OUT may be changed by adjusting the variable resistor $V_R$. According to the circuit of FIG. 8, the comparison voltage is applied after the voltages at the output points B and C are determined by the transistors T10 and T11. Thus, the initial voltages at the output points B and C are set. This circuit is of the static system which promises more stable operation as compared with the dynamic system, since the potentials at the output points B and C may be determined by the ratios of the transistors T1 and T2 and the transistors T3 and T4.

According to this invention, as described above, the output voltage of the integrating circuit is compared with the reference voltage of the reference voltage circuit, so that the output pulse width may greatly be improved in accuracy without involving any substantial variations.

What we claim is:

1. A monostable multivibrator comprising an integrating circuit including a capacitor, a resistor, and an output terminal; a comparator including first and second inverters each connected between a voltage source and a predetermined potential point, and each having an output terminal; a reference voltage source to produce a reference voltage signal; a first switching transistor circuit connected between the output terminal of said integrating circuit and the output point of said first inverter of said comparator; a second switching transistor circuit connected between said reference voltage source and the output point of said second inverter of said comparator; a flip-flop having at least two input terminals and an output terminal, said input terminals being connected respectively with the output point of said first inverter and a reset signal source, said flip-flop being set to produce an output signal in response to a signal from the output point of said first inverter; and a switching transistor on-off controlled by the output signal of said flip-flop to control the discharge of said capacitor of said integrating circuit; said comparator comparing the output signal of said integrating circuit with said reference voltage signal from said reference voltage source in response to the switching operation of said first and second switching transistor circuits, thereby resetting said flip-flop in accordance with the comparison output.

2. A monostable multivibrator according to claim 1, wherein each of said first and second inverters of said comparator is composed of first, second and third enhancement type MOS transistors connected in series between said voltage source and said predetermined potential point, the connecting points of said first and second transistors of said inverters being connected to their corresponding inverter output points, the gate of said third transistor of said first inverter being connected to the connecting point of said first and second transistors of said second inverter, the gate of said third transistor of said second inverter being connected to the connecting point of said first and second transistors of said first inverter, said first and second transistors of said pair of inverters operating in response to a clock pulse.

3. A monostable multivibrator according to claim 2, wherein each of said inverters further includes a depletion type MOS transistor connected between said voltage source and said first MOS transistor.

4. A monostable multivibrator according to claim 1, wherein each of said inverters has a complementary MOS circuit construction.

5. A monostable multivibrator according to claim 1 or 2, wherein said voltage source connected to said inverters of said comparator is formed of a pulse voltage source to produce pulsative voltage.

6. A monostable multivibrator according to claim 1 or 2, wherein said first transistor switching circuit is composed of fifth and sixth MOS transistors connected in series between said voltage source and the output points of said first inverter, and said second transistor switching circuit is composed of seventh and eighth MOS transistors connected in series between said voltage source and the output point of said second inverter, said fifth and seventh MOS transistors operating respectively in response to the outputs of said integrating circuit and said reference voltage source, said sixth and eighth MOS transistors operating in response to a clock pulse.

7. A monostable multivibrator according to claim 1, wherein each of said first and second inverters of said comparator is composed of first and second MOS transistors connected in series between said voltage source and said predetermined potential point, and a third MOS transistor connected in parallel with said second MOS transistor and operating in response to a reset control signal, the connecting point of said respective first and second transistors of said first and second inverters being connected to their corresponding inverter output points and to said first and second transistor switching circuits, respectively.

8. A monostable multivibrator according to claim 7, wherein each of said first and second transistor switching circuits is composed of at least two MOS transistors connected in series between said voltage source and the corresponding one of said inverter output points, one MOS transistor of each of said first and second transistor switching circuits operating in response to the clock pulse, the gate of the other transistor of said first transistor switching circuit being connected to the output terminal of said integrating circuit, the gate of the other transistor of said second transistor switching circuit being connected to said reference voltage source.

9. A monostable multivibrator according to any one of claims 1, 3, 4, 7, or 8 further comprising a start circuit to produce a start signal for starting said flip-flop.

* * * * *